United States Patent
Butzmann

(10) Patent No.: US 9,728,993 B2
(45) Date of Patent: Aug. 8, 2017

(54) BATTERY MANAGEMENT SYSTEM AND BATTERY SYSTEM

(71) Applicants: Robert Bosch GmbH, Stuttgart (DE); Samsung SDI Co., Ltd., Yongin-si, Gyeonggi-do (KR)

(72) Inventor: Stefan Butzmann, Schalksmühle (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 119 days.

(21) Appl. No.: 14/649,487

(22) PCT Filed: Nov. 20, 2013

(86) PCT No.: PCT/EP2013/074251
§ 371 (c)(1),
(2) Date: Jun. 3, 2015

(87) PCT Pub. No.: WO2014/090529
PCT Pub. Date: Jun. 19, 2014

(65) Prior Publication Data
US 2015/0333541 A1 Nov. 19, 2015

(30) Foreign Application Priority Data
Dec. 11, 2012 (DE) .................. 10 2012 222 720

(51) Int. Cl.
| | | |
|---|---|---|
| H02J 7/00 | (2006.01) | |
| H01M 2/34 | (2006.01) | |
| H01M 10/42 | (2006.01) | |
| H01M 10/48 | (2006.01) | |
| B60L 3/00 | (2006.01) | |
| B60L 3/04 | (2006.01) | |
| B60L 11/18 | (2006.01) | |
| G01R 31/36 | (2006.01) | |

(52) U.S. Cl.
CPC ............ *H02J 7/007* (2013.01); *B60L 3/0046* (2013.01); *B60L 3/04* (2013.01); *B60L 11/1855* (2013.01); *B60L 11/1857* (2013.01); *B60L 11/1862* (2013.01); *G01R 31/3658* (2013.01); *H01M 2/34* (2013.01); *H01M 10/425* (2013.01); *H01M 10/482* (2013.01); *H02J 7/0013* (2013.01); *H02J 7/0021* (2013.01); *H02J 7/0031* (2013.01); *B60L 2240/545* (2013.01); *B60L 2240/547* (2013.01); *B60L 2240/549* (2013.01); *B60L 2250/10* (2013.01); *G01R 31/3606* (2013.01); *H01M 2010/4271* (2013.01); *H01M 2200/00* (2013.01); *Y02T 10/705* (2013.01); *Y02T 10/7011* (2013.01); *Y02T 10/7044* (2013.01); *Y02T 10/7055* (2013.01)

(58) Field of Classification Search
CPC ..... Y02E 60/12; H01M 2/1055; H01M 10/46; H01M 10/425; H02J 7/0045
USPC .......................................................... 320/112
See application file for complete search history.

(56) References Cited

U.S. PATENT DOCUMENTS

| | | | | |
|---|---|---|---|---|
| 5,889,386 A | * | 3/1999 | Koenck ................... | H02J 9/061 320/107 |
| 7,372,234 B2 | * | 5/2008 | Fujii ..................... | H02J 7/0031 320/106 |
| 2006/0181244 A1 | * | 8/2006 | Luo ..................... | H01M 10/441 320/128 |
| 2007/0108941 A1 | * | 5/2007 | Sainomoto ............ | H02J 7/0021 320/112 |
| 2011/0238012 A1 | * | 9/2011 | Cassidy ................. | A61M 5/44 604/113 |
| 2012/0035874 A1 | | 2/2012 | Yun et al. | |

FOREIGN PATENT DOCUMENTS

| | | |
|---|---|---|
| DE | 699 27 934 T2 | 7/2006 |
| DE | 10 2011 004 980 A1 | 9/2012 |
| EP | 2 166 642 A1 | 3/2010 |
| EP | 2 493 003 A1 | 8/2012 |

OTHER PUBLICATIONS

International Search Report corresponding to PCT Application No. PCT/EP2013/074251, mailed Jan. 2, 2014 (German and English language document) (6 pages).

* cited by examiner

*Primary Examiner* — Arun Williams
(74) *Attorney, Agent, or Firm* — Maginot, Moore & Beck LLP

(57) ABSTRACT

A rechargeable battery includes a plurality of interconnected battery cells which are connected to at least one pole connection of the battery by at least one circuit element such that the plurality of interconnected battery cells can be electrically decoupled from the at least one pole connection. A control circuit for monitoring and controlling the battery comprises at least one first cell monitoring device and at least one second cell monitoring device which are configured to detect operational parameters of at least one battery cell of the plurality of interconnected battery cells and to guide the operational parameters to a control device. The at least one first cell monitoring device is connected to a first control device by a first interface, and the at least one second cell monitoring device is connected to a second control device by a second interface.

8 Claims, 2 Drawing Sheets

BATTERY MANAGEMENT SYSTEM AND BATTERY SYSTEM

This application is a 35 U.S.C. §371 National Stage Application of PCT/EP2013/074251, filed on Nov. 20, 2013, which claims the benefit of priority to Ser. No. DE 10 2012 222 720.2, filed on Dec. 11, 2012 in Germany, the disclosures of which are incorporated herein by reference in their entirety.

The disclosure relates to a regulating circuit, in particular a battery management system, for monitoring and regulating the operation of a rechargeable battery, in particular a lithium ion battery, having a plurality of battery cells which are connected to one another and are connected to at least one pole connection of the battery by means of at least one switching element in such a manner that they can be electrically decoupled, the regulating circuit having at least one first cell monitoring device and at least one second cell monitoring device each designed to record operating parameters of at least one battery cell and to forward them to a control device.

The disclosure also relates to a battery system comprising a rechargeable battery having a plurality of battery cells which are connected to one another and are connected to at least one pole connection of the battery by means of at least one switching element in such a manner that they can be electrically decoupled, and a regulating circuit, in particular a battery management system, for monitoring and regulating the operation of the battery.

Background

Regulating circuits for monitoring and regulating the operation of a rechargeable battery are known in the prior art, in particular under the name battery management system. In this case, operation of a battery is considered to be, on the one hand, a discharging operation of a battery, that is to say in particular the use of such a battery with a corresponding electrical load, and, on the other hand, a charging operation of a battery. In known regulating circuits, the cell voltages of the battery cells are recorded in this case as measured values by a plurality of so-called cell supervision circuits (CSCs) and are transmitted to a central control device, the so-called battery control unit (BCU), via a communication bus. Currents measured by a current sensor can also be transmitted as further measured values to the battery control unit. By evaluating the measured values, the battery control unit determines battery properties such as, inter alia, the state of charge (SOC) of individual battery cells and the aging of individual battery cells, which is also referred to as the state of health (SOH).

In addition, in such regulating circuits, the battery control unit is allocated the task of electrically disconnecting individual battery cells or a group of battery cells from the pole connections of the battery by controlling contactors if recorded measured values indicate a critical cell state of these battery cells. Such disconnection of battery cells is very important in order to avoid major damage both to the battery and to an electrical load supplied by the battery or to a charging device of the battery. This is important, in particular, since damaged batteries such as lithium ion batteries may also result in risks for the user of such batteries, for example risk of fire and explosion.

On account of the relevance to safety, an attempt is therefore made, by means of diagnoses, to achieve the situation in which operating parameters relevant to the safety state of a battery cell, such as the cell voltages in particular, are reliably recorded and are reliably transmitted to the battery control unit via the communication bus. In this case, there is a constant need to further improve, in particular, the transmission security of the operating parameters in order to make it possible to reliably detect safety-critical states of battery cells.

The use of further diagnostic systems or further diagnostic routines results in this case in the disadvantage that the complexity of such regulating circuits is increased, in particular at the expense of the performance of such regulating circuits. The redundancy required on account of the relevance to safety when transmitting all operating parameters recorded by the cell supervision circuits to the battery control unit via the communication bus results in the further disadvantage that the communication bus is heavily utilized. In addition, such regulating circuits have low scalability as a further disadvantage.

Against this background, an object of the present disclosure is to improve a regulating circuit for monitoring and regulating the operation of a rechargeable battery, in particular a lithium ion battery, in particular with regard to improved performance of such a regulating circuit and with regard to improved detection of safety-critical states of the battery cells and more reliable electrical disconnection of the battery cells from the pole connections of the battery when a critical cell state is present.

Summary

In order to achieve the object, a regulating circuit for monitoring and regulating the operation of a rechargeable battery, in particular a lithium ion battery, having a plurality of battery cells which are connected to one another and are connected to at least one pole connection of the battery by means of at least one switching element in such a manner that they can be electrically decoupled is proposed, the regulating circuit having at least one first cell monitoring device and at least one second cell monitoring device each designed to record operating parameters of at least one battery cell and to forward them to a control device, and the at least one cell monitoring device being connected to a first control device via a first interface and the at least one second cell monitoring device being connected to a second control device via a second interface, the first control device being designed to determine battery properties by evaluating received operating parameters, and the second control device being designed to control the at least one switching element. In this case, the battery cells may advantageously be able to be electrically decoupled in each case individually or as a group of battery cells by means of the at least one switching element, a group of battery cells also being able to include, in particular, all battery cells. The at least one switching element which is used to connect the battery cells to the at least one pole connection of the battery in each case individually or in groups, for example in groups of twelve battery cells, is preferably a contactor, particularly preferably an electrically controllable contactor. The at least one switching element opens and closes the electrical contact between the battery cells and the at least one pole connection of the battery on the basis of the control by the second control device. The regulating circuit for monitoring and regulating the operation of a rechargeable battery is advantageously a battery management system. The disclosure provides, in particular, for the at least one first cell monitoring device and the at least one second cell monitoring device to each be set up in such a manner that these cell monitoring devices each record the operating parameters of the same at least one battery cell. This advantageously produces redundancy when recording the operating parameters, thus advantageously increasing the reliability when determining critical cell states.

Another advantageous aspect of the disclosure provides for the primary function of the first control device to involve determining battery properties and forwarding these battery properties to further devices, in particular also to a superordinate further control device, in the form of information. When a regulating circuit according to the disclosure is used in connection with a vehicle battery used in a hybrid or electric motor vehicle, such a superordinate control device may be, for example, a superordinate vehicle control unit which is involved in controlling the drive components, for example. According to the disclosure, battery properties determined by the first control device by evaluating received operating parameters are, in particular, the state of charge of the battery (SOC), the aging state of the battery (SOH) and/or the functional state of the battery (SOF: state of function). In addition, the first control device is designed to determine a cell state, in particular a critical cell state, as a battery property. In contrast, the primary function of the second control device is to control the at least one switching element. This advantageously separates the determination of general battery properties and the safety-relevant control of the at least one switching element, that is to say the opening and closing of the electrical contact between the battery cell and the pole connection.

According to one particularly preferred refinement of the disclosure, the first control device is designed to determine a cell state as a battery property and to transmit a switching element control signal to the second control device on the basis of the cell state determined. In particular, the first control device is designed in this case to determine a critical cell state as a battery property. In this case, a critical cell state is present, in particular, when an unusually high or unusually low cell voltage is recorded at a battery cell as an operating parameter. Further operating parameters which are used by the first control device to determine a critical cell state are, in particular, measured values which exceed predefined maximum limit values or undershoot minimum limit values. In addition to cell voltages, the operating parameters may also relate in this case to the cell temperature or cell currents, for example. If the first control device has determined a critical cell state, the first control device is advantageously designed to signal this critical cell state to the second control device by transmitting a switching element control signal. For this purpose, the first control device is advantageously connected to the second control device via a signal line. The transmitted switching element control signal advantageously causes the second control device, upon receiving the switching element control signal, to control the at least one switching element on the basis of the switching element control signal. In particular, provision is made for a switching element control signal to cause the second control device to control the at least one switching element in such a manner that the at least one switching element opens or closes, preferably on the basis of the switching element control signal. Provision is advantageously made for the first control device to be designed to generate two different switching element control signals for this purpose, namely an opening signal and a closing signal. That is to say, although the first control device generates a control signal for controlling the at least one switching element, the first control device does not directly control the at least one switching element in this case but rather transmits the switching element control signal to the second control device. In this case, the second control device is designed, upon receiving a switching element control signal, to control the at least one switching element on the basis of the received switching element control signal and to thereby open or close the electrical contact between the battery cells and the at least one pole connection of the battery.

According to one likewise particularly preferred development of the disclosure, the second control device is also designed to determine a cell state, in particular a critical cell state, by evaluating received operating parameters. In this case, as a result of the critical cell state being determined, a switching element control signal transmitted from the first control device to the second control device is checked for plausibility according to the disclosure. The decision as regards whether the at least one switching element is actually actuated upon request by the first control device, that is to say on the basis of the transmission of a switching element control signal, is made by the second control device. In this case, this decision is based, according to the disclosure, on the evaluation of received operating parameters by the second control device. In this respect, this decision as regards whether the at least one switching element is controlled upon receiving a switching element control signal is made independently of an evaluation result of the first control device.

According to another advantageous refinement of the disclosure, at least one comparator unit is connected to the second control device via a third interface, the at least one comparator unit being designed to determine a critical limit value deviation by comparing recorded operating parameters of a battery cell with at least one limit value and to signal this limit value deviation to the second control device by transmitting an alarm signal. In this case, the at least one comparator unit is advantageously designed to detect exceeding of a maximum cell voltage limit value and/or undershooting of a minimum cell voltage limit value. The at least one comparator unit is preferably generally designed to record a cell voltage value that deviates from an expected value and to separate critical cell voltages from non-critical cell voltages on the basis of the deviation difference. For this purpose, the respective comparator advantageously compares recorded cell voltage measured values with predefined cell voltage values, in particular with predefined maximum and minimum cell voltage values. If the comparator determines deviation from an expected cell voltage value, in particular exceeding of a maximum cell voltage value or undershooting of a minimum cell voltage measured value, the comparator transmits an alarm signal to the second control device as an operating parameter.

Another advantageous refinement of the disclosure provides for the second control device to be designed to control the at least one switching element when this second control device receives a switching element control signal from the first control device and this second control device has also determined a critical cell state and/or has received an alarm signal from the at least one comparator unit. As a result of the alarm signal transmitted by the at least one comparator unit, redundancy for the cell state determined by the second control device is advantageously produced in this case. According to this advantageous aspect of the disclosure, the following refinements are provided, in particular: the second control device controls the at least one switching element if the second control device has received a switching element control signal from the first control device and if the second control device has determined a critical cell state on the basis of evaluation of operating parameters recorded by the at least one second cell monitoring device. Or: the second control device controls the at least one switching element when the second control device has received a switching element control signal from the first control device and when the second control device has received an alarm signal provided by the at least one comparator unit. Or: the second control device controls the at least one switching element when the second control device has received a switching element control signal from the first control device and when the second control device has determined a critical cell state on the basis of evaluation of operating parameters recorded by the at least one second cell monitoring device and when the second control device has received an alarm signal from the at least one comparator unit. According to another advantageous refinement of the disclosure, the second control device is also designed to generate a switching element control signal if the second control device has received an alarm signal from at least one comparator unit and has determined a critical cell state on the basis of evaluation of operating parameters recorded by the at least one second cell monitoring device.

According to another advantageous aspect of the disclosure, the at least one first cell monitoring device and the at least one second cell monitoring device are each designed to record cell voltages as operating parameters of the at least one battery cell. The cell monitoring devices are advantageously so-called cell supervision circuits. These cell supervision circuits preferably each have an application-specific integrated circuit (ASIC) which is designed to record cell voltages as cell voltage measured values. According to one refinement variant of the disclosure, the cell monitoring device or the cell supervision circuit also has a microcontroller which can transmit recorded operating parameters to the respective control device using the first or second interface. According to another advantageous aspect of the disclosure, the at least one second cell monitoring device is designed to record minimum cell voltages and/or maximum cell voltages as operating parameters of the at least one battery cell. This recording of only minimum and maximum cell voltages according to the disclosure advantageously reduces the volume of data to be transmitted via the second interface. Since a critical cell state is usually distinguished by unusual cell voltages, a critical cell state can be determined using minimum and maximum cell voltage measured values. The volume of data to be evaluated by the second control device is advantageously reduced in this refinement variant.

According to one particularly advantageous refinement of the disclosure, a plurality of first cell monitoring devices and a plurality of second cell monitoring devices are provided, the plurality of first cell monitoring devices being connected to the first control device in a daisy-chain topology via the first interface, and the plurality of second cell monitoring devices being connected to the second control device in a daisy-chain topology via the second interface. In this case, the first and second cell monitoring devices are advantageously each arranged in a chain, the cell monitoring device at the start of the chain in each case being at an electrical potential and the respective downstream cell monitoring devices in the chain each being at a lower electrical potential in a cascade-like manner toward the first control device or toward the second control device. In this case, the cell voltages recorded as operating parameters are transmitted in such a manner that the cell voltage recorded by one cell monitoring device is respectively transmitted to the cell monitoring device at a lower potential and the respective cell monitoring device at the lowest potential transmits all cell voltages recorded by the cell monitoring devices to the respective control device (daisy-chain transmission). During such transmission, it is advantageously unnecessary for the cell voltages recorded by a cell monitoring device to each be transmitted to the respective control device via a microcontroller and an isolated communication bus. This advantageously makes it possible to reduce the hardware complexity. The regulating circuit according to the disclosure advantageously also has a plurality of comparator units, the plurality of comparator units being connected to the second control device in a daisy-chain topology via the third interface. In this case, the signals are transmitted in the manner described in connection with the cell monitoring devices.

Another advantageous aspect of the disclosure proposes a battery system having a rechargeable battery having a plurality of battery cells which are connected to one another and are connected to at least one pole connection of the battery by means of at least one switching element in such a manner that they can be electrically decoupled, and a regulating circuit according to the disclosure.

In order to achieve the object mentioned at the outset, a method for controlling at least one switching element, by means of which battery cells of a battery are connected to at least one pole connection of the battery, is also proposed, which method is characterized in that operating parameters of the battery cells are recorded by a plurality of first cell monitoring devices and are transmitted to a first control device and operating parameters of the same battery cells are recorded by a plurality of second cell monitoring devices and are transmitted to a second control device, the first control device evaluating the recorded operating parameters and transmitting a switching element control signal to a second control device if a critical cell state is determined, and the second control device evaluating the recorded operating parameters and, if a switching element control signal is received from the first control device and if a critical cell state is determined by evaluating recorded operating parameters, the second control device controlling the at least one switching element according to the switching element control signal. Controlling the at least one switching element causes the at least one switching element to open or close in this case. A critical cell state is, in particular, such a state of the cell in which operating parameters, for example the cell voltage or the cell temperature or cell currents of a battery cell, assume values which deviate from an expected value for the corresponding operating parameter by a predefined amount. According to one particularly preferred refinement of the method, a regulating circuit according to the disclosure is used to carry out the method. One particularly advantageous refinement of the method also provides for cell voltages to be recorded by the cell monitoring devices as operating parameters and to be evaluated by the control devices. The first cell monitoring devices and the second cell monitoring devices are advantageously each connected to the first and/or second control device in a daisy-chain topology.

In order to control the at least one switching element by means of the second control device, provision is advantageously made for the second control device to have to have received a switching element control signal from the first control device and additionally for an evaluation of operating parameters recorded by the second cell monitoring devices, as carried out by the second control device, to have evaluated a cell state as critical. In this case, provision is made for these two conditions for controlling the at least one switching element to advantageously be complied with in the same operating cycle of the second control device, that is to say substantially at the same time. Another advantageous refinement also provides for a received switching element control signal and/or a determined critical cell state to be held or stored as a value over a plurality of operating cycles, with the result that the at least one switching element is also controlled when the two conditions occur with a slight time delay, that is to say a few operating cycles, for example six operating cycles, lie between the reception of the switching element control signal and the determination of a critical cell state.

BRIEF DESCRIPTION OF THE DRAWINGS

Further advantageous details, features and refinement details of the disclosure are explained in more detail in connection with the exemplary embodiments illustrated in the figures, in which.

DETAILED DESCRIPTION

Figure 1:
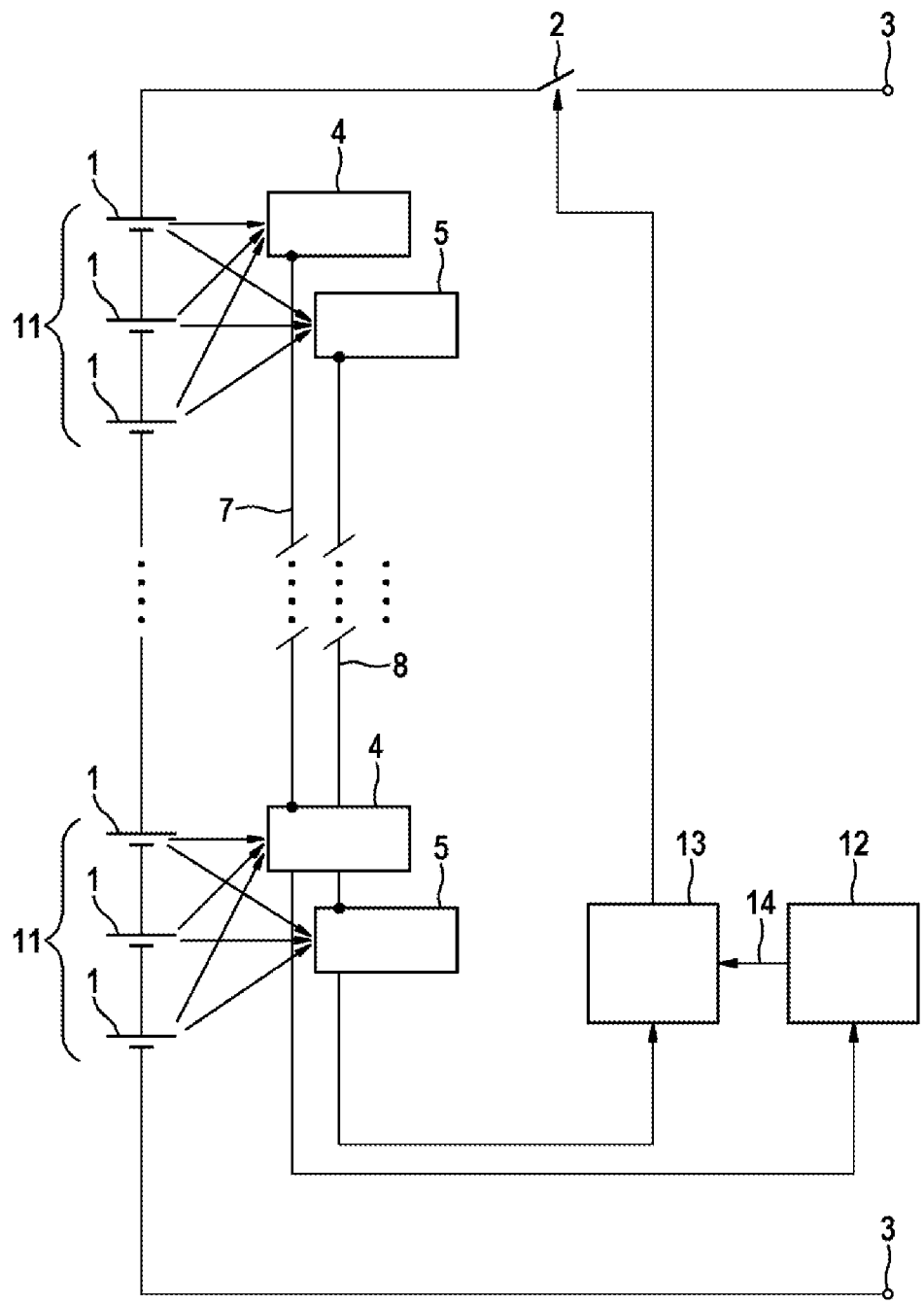
FIG. 1 shows a schematic illustration of an exemplary embodiment of a battery system according to the disclosure.

In the battery system illustrated in FIG. 1, a plurality of battery cells 1 have been interconnected to form a rechargeable battery. In this case, the battery cells 1 can be electrically decoupled from the pole connection 3 of the battery and therefore from an electrical load or from a charging apparatus for charging the battery via the switching element 2 in the form of a contactor. One refinement variant of the disclosure (not illustrated) provides for individual battery cells or smaller groups of battery cells, for example a group of four battery cells, to also be able to be disconnected from the battery via corresponding switching elements, a corresponding switching element preferably being arranged between the individual battery cells and a corresponding parallel circuit provided with a switching element respectively being provided for bridging the battery cell.

The battery system illustrated in FIG. 1 has a regulating circuit for monitoring and regulating the operation of the rechargeable battery. First cell monitoring devices 4 and second cell monitoring devices each record the respective cell voltages of the battery cells 1 of three battery cells 1 combined to form a group 11 as operating parameters. In this case, the cell monitoring devices 4 and 5 are in the form of application-specific integrated circuits (ASICs) for recording cell voltages and are connected to the respective control device 12 or 13 in a daisy-chain topology. In this case, the respective cell monitoring device of the cell monitoring devices 4 and 5 is respectively at a different voltage potential. In this case, cell voltages recorded by a cell monitoring device 4 or 5 are respectively transmitted to that cell monitoring device 4 or 5 which is at a lower voltage potential, the recorded cell voltages finally being transmitted from the last cell monitoring device 4 or 5 in the daisy chain (the cell monitoring device 4 or 5 directly connected to the respective control device 12 or 13 in FIG. 1) to the control device 12 or 13.

The cell voltages or cell voltage measured values recorded by the first control device 12 in this manner as operating parameters are evaluated by the first control device 12. The first control device 12 determines battery properties such as the state of charge (SOC) of the battery and the aging (SOH) of the battery on the basis of the evaluation. The first control device 12 also determines critical cell states as a further battery property on the basis of the evaluation of recorded cell voltages. If the first control device 12 has determined a critical cell state, the first control device 12 generates a switching element control signal and transmits it to the second control device 13 via the communication bus 14.

The second control device 13 evaluates the cell voltage measured values recorded by the second cell monitoring devices 5 as operating parameters in order to determine whether there is a critical cell state. For this purpose, the second control device 13 checks, in particular, whether recorded cell voltage measured values deviate significantly from a stipulated expected value. If the second control device 13 receives a switching element control signal from the first control device 12, the second control device 13 controls the switching element 2 only when the evaluation by the second control device has revealed that recorded cell voltages deviate significantly from an expected value and a cell state is therefore classified as critical. The second control device 13 keeps received switching element control signals and determined critical cell states as an event, advantageously over eight operating cycles, in a storage element (not explicitly illustrated in FIG. 1) and controls the switching element 2 when both events occur in one cycle of eight operating cycles. If the second control device 13 receives a switching element control signal from the first control device 12 and if a critical cell state is not determined by the second control device 13 itself in this case, the second control device 13 does not control the switching element 2.

Figure 2:
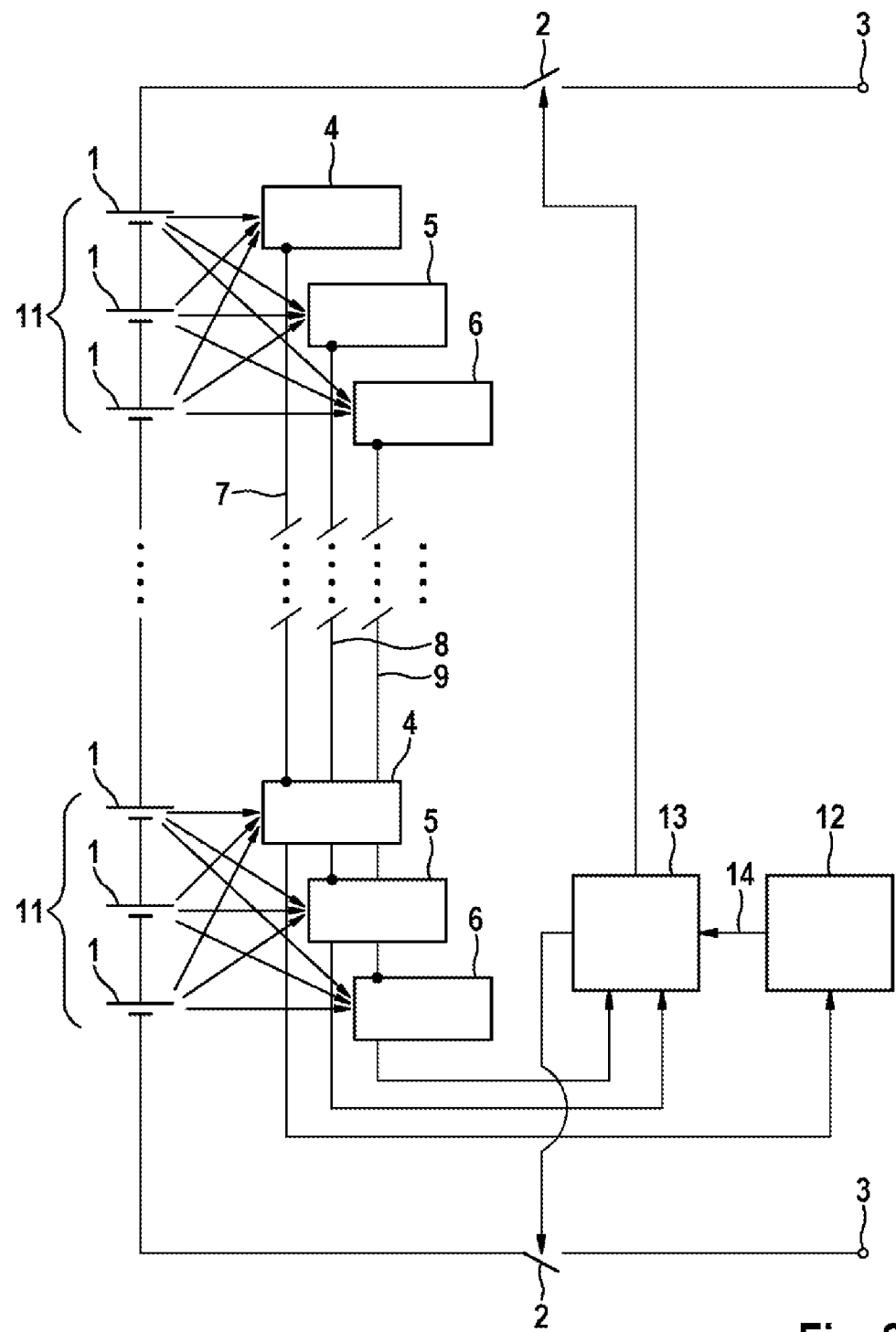
FIG. 2 shows a schematic illustration of another exemplary embodiment of a battery system according to the disclosure.

FIG. 2 illustrates another exemplary embodiment of a battery system according to the disclosure. This system has a battery having a plurality of battery cells 1 which are connected to one another. In this case, the battery cells 1 are electrically connected, as a whole, to the pole connections 3 of the battery by means of the switching elements 2 in the form of contactors. The battery cells 1 can be electrically decoupled from the pole connections 3 of the battery by opening the contactors 2. Cell monitoring devices 4 and 5 each monitor the cell voltages of a group 11 of battery cells 1, as described in connection with FIG. 1. The regulating circuit also has comparator units 6 which, like the second cell monitoring devices 5, are connected to the second control device 13 in a daisy-chain topology. The comparator units 6 are designed in such a manner that only maximum and minimum cell voltage measured values are recorded. In this case, maximum cell voltage measured values are those measured values which exceed a stipulated maximum cell voltage limit value. In this case, minimum cell voltage measured values are those measured values which undershoot a predefined minimum cell voltage measured value. When such a maximum or minimum cell voltage measured value is determined, the respective comparator unit 6 generates an alarm signal and transmits it to the second control device 13.

The second control device 13 which is designed to control the switching elements 2 therefore receives in the present case, as operating parameters, cell voltage measured values recorded by the second cell monitoring devices 5, possibly an alarm signal generated by at least one of the comparator units 6 and possibly a switching element control signal generated by the first control device 12 on the basis of evaluation of cell voltages recorded by the first cell monitoring devices 4. In this case, the second control device 13 controls the switching elements 2 when the second control device 13 receives a switching element control signal from the first control device 12 via the communication bus 14 and itself has determined a critical cell state in this case by evaluating the recorded cell voltages and has also received an alarm signal from at least one of the comparator units 6. That is to say, the switching elements 2 are triggered, that is to say the switching elements 2 are opened or closed, only when both the first control device 12 and the second control device and at least one of the comparator units 6 have determined a critical cell state.

The exemplary embodiments illustrated in the figures and explained in connection with the latter are used to explain the disclosure and do not restrict the latter.

The invention claimed is:

1. A regulating circuit for monitoring and regulating operation of a rechargeable battery having a plurality of interconnected battery cells and at least one pole connection connected to the battery cells by at least one switching element, such that the battery cells are electrically decoupleable from the at least one pole connection, the regulating circuit comprising:
a first control device;
at least one first cell monitoring device connected to the first control device via a first interface, the at least one first cell monitoring device configured to record first measurements of operating parameters of at least one battery cell of the plurality of interconnected battery cells and to forward the first measurements of operating parameters to the first control device;
a second control device;
at least one second cell monitoring device connected to the second control device via a second interface, the at least one second cell monitoring device configured to record second measurements of operating parameters of at least one battery cell of the plurality of interconnected battery cells and to forward the second measurements of operating parameters to the second control device;
wherein the first control device is configured to (i) determine a critical cell state by evaluating the first measurements of operating parameters and (ii) transmit a switching element control signal to the second control device in response to the critical cell state being determined based on the evaluation of the first measurements of operating parameters, and
wherein the second control device is configured to (i) determine the critical cell state by evaluating the second measurements of operating parameters and (ii) control the at least one switching element according to the switching element control signal in response to the switching element control signal being received from the first control device and the critical cell state being determined based on the evaluation of the second measurements of operating parameters.

2. The regulating circuit as claimed in claim 1, further comprising:
at least one comparator unit connected to the second control device via a third interface, the at least one comparator unit configured to (i) record third measurements of operating parameters of at least one battery cell of the plurality of interconnected battery cells, (ii) determine a limit value deviation by comparing the third measurements of operating parameters with at least one limit value, and (iii) signal the determined limit value deviation to the second control device by transmitting an alarm signal.

3. The regulating circuit as claimed in claim 2, wherein the second control device is configured to control the at least one switching element when the second control device receives the switching element control signal from the first control device and has received the alarm signal from the at least one comparator unit.

4. The regulating circuit as claimed in claim 1, wherein the at least one first cell monitoring device and the at least one second cell monitoring device are each configured to record cell voltages as operating parameters of the at least one battery cell.

5. The regulating circuit as claimed in claim 1, wherein the at least one second cell monitoring device is configured to record minimum cell voltages and/or maximum cell voltages as operating parameters of the at least one battery cell.

6. The regulating circuit as claimed in claim 1, wherein:
the at least one first cell monitoring device includes a plurality of first cell monitoring devices connected to the first control device in a daisy-chain topology via the first interface; and
the at least one second cell monitoring device includes a plurality of second cell monitoring devices connected to the second control device in a daisy-chain topology via the second interface.

7. A battery system comprising:
a rechargeable battery having a plurality of interconnected battery cells and at least one pole connection connected to the battery cells by at least one switching element, such that the battery cells are electrically decoupleable from the at least one pole connection; and
a regulating circuit configured to monitor and regulate operation of the rechargeable battery, the regulating circuit including:
a first control device;
at least one first cell monitoring device connected to the first control device via a first interface, the at least one first cell monitoring device configured to record first measurements of operating parameters of at least one battery cell of the plurality of interconnected battery cells and to forward the first measurements of operating parameters to the first control device;
a second control device;
at least one second cell monitoring device connected to the second control device via a second interface, the at least one second cell monitoring device configured to record second measurements of operating parameters of at least one battery cell of the plurality of interconnected battery cells and to forward the second measurements of operating parameters to the second control device;
wherein the first control device is configured to (i) determine a critical cell state by evaluating the first measurements of operating parameters and (ii) transmit a switching element control signal to the second control device in response to the critical cell state being determined based on the evaluation of the first measurements of operating parameters, and
wherein the second control device is configured to (i) determine the critical cell state by evaluating the second measurements of operating parameters and (ii) control the at least one switching element according to the switching element control signal in response to the switching element control signal being received from the first control device and the critical cell state being determined based on the evaluation of the second measurements of operating parameters.

8. A method for controlling at least one switching element through which battery cells of a battery are connected to at least one pole connection of the battery, comprising:
- recording first measurements of operating parameters of the battery cells with a plurality of first cell monitoring devices;
- transmitting the first measurements of operating parameters recorded with the plurality of first cell monitoring devices to a first control device;
- recording second measurements of operating parameters of the same battery cells with a plurality of second cell monitoring devices;
- transmitting the second measurements of operating parameters recorded with the plurality of second cell monitoring devices to a second control device;
- determining a critical cell state by evaluating, with the first control device, the first measurements of operating parameters;
- transmitting a switching element control signal to the second control device with the first control device in response to the critical cell state being determined based on the evaluation of the first measurements of operating parameters;
- determining the critical cell state by evaluating, with the second control device, the second measurements of operating parameters; and
- controlling the at least one switching element with the second control device according to the switching element control signal in response to the switching element control signal being received from the first control device and the critical cell state being determined based on the evaluation of the second measurements of operating parameters.

* * * * *